US008813677B2

(12) United States Patent
Sudo et al.

(10) Patent No.: US 8,813,677 B2
(45) Date of Patent: Aug. 26, 2014

(54) COMPOSITE PARTICULATE PREPARING APPARATUS AND METHOD

(75) Inventors: Go Sudo, Kanagawa (JP); Kenji Katori, Kanagawa (JP); Hayato Hommura, Kanagawa (JP)

(73) Assignee: Sony Corporation, Tokyo (JP)

( * ) Notice: Subject to any disclaimer, the term of this patent is extended or adjusted under 35 U.S.C. 154(b) by 351 days.

(21) Appl. No.: 12/874,633

(22) Filed: Sep. 2, 2010

(65) Prior Publication Data

US 2011/0064875 A1 Mar. 17, 2011

(30) Foreign Application Priority Data

Sep. 11, 2009 (JP) ................................. 2009-210869

(51) Int. Cl.
| | | |
|---|---|---|
| C23C 16/458 | (2006.01) | |
| C23C 16/44 | (2006.01) | |
| C23C 16/00 | (2006.01) | |
| B05C 13/02 | (2006.01) | |
| B05C 13/00 | (2006.01) | |
| C23C 14/54 | (2006.01) | |
| C23C 14/50 | (2006.01) | |
| C23C 14/22 | (2006.01) | |

(52) U.S. Cl.
CPC ............. *C23C 14/545* (2013.01); *C23C 14/505* (2013.01); *C23C 14/50* (2013.01); *C23C 14/22* (2013.01)
USPC ............. 118/52; 118/730; 118/729; 118/728; 118/716

(58) Field of Classification Search
None
See application file for complete search history.

(56) References Cited

U.S. PATENT DOCUMENTS

| | | | | |
|---|---|---|---|---|
| 2,846,971 A | * | 8/1958 | Baer et al. ...................... | 118/716 |
| 4,116,161 A | * | 9/1978 | Steube .......................... | 118/715 |
| 4,448,821 A | * | 5/1984 | Buschor ........................ | 427/424 |
| 4,614,162 A | * | 9/1986 | Ryan et al. ...................... | 118/19 |
| 4,715,316 A | * | 12/1987 | Broomfield et al. .......... | 118/716 |
| 4,758,288 A | * | 7/1988 | Versic .............................. | 149/6 |
| 4,983,157 A | * | 1/1991 | Pober et al. ..................... | 494/37 |
| 5,198,272 A | * | 3/1993 | Eisfeller ....................... | 427/251 |
| 5,393,346 A | * | 2/1995 | Cholewa ....................... | 118/320 |
| 5,470,388 A | * | 11/1995 | Goedicke et al. ............. | 118/716 |
| 5,494,709 A | * | 2/1996 | Long et al. ........................ | 427/4 |
| 5,593,097 A | * | 1/1997 | Corbin ............................ | 241/21 |
| 5,601,873 A | * | 2/1997 | Nakazawa et al. ............ | 427/212 |
| 5,698,252 A | * | 12/1997 | Kelly et al. .................... | 426/289 |
| 5,750,996 A | * | 5/1998 | Drennen et al. ........... | 250/341.2 |
| 5,846,587 A | * | 12/1998 | Kelly et al. ................... | 426/289 |

(Continued)

FOREIGN PATENT DOCUMENTS

JP 2008-045197 2/2008

*Primary Examiner* — Dah-Wei D Yuan
*Assistant Examiner* — Jethro Pence
(74) *Attorney, Agent, or Firm* — Dentons US LLP

(57) ABSTRACT

A composite particulate preparing apparatus is provided that includes a rotating body receiving particulates to which an adhering material is allowed to adhere and having a bottom surface, a side wall and a flange part; a centrifugal machine rotating the rotating machine to apply centrifugal force to the particulates in the rotating body; an inclination varying device shifting the rotating body at an arbitrary inclination angle so that the bottom surface of the rotating body forms a vertical plane parallel to a gravitational direction from a horizontal plane perpendicular to the gravitational direction; and a stirring device disposed closer to a horizontal line perpendicular to a vertical line drawn from a rotational center of the rotating body in a gravitational direction on a rotational side where the particulates drop from an uppermost point, than to the vertical line.

13 Claims, 7 Drawing Sheets

(56) References Cited

U.S. PATENT DOCUMENTS

| | | | | |
|---|---|---|---|---|
| 5,882,725 | A * | 3/1999 | Radford | 427/212 |
| 6,060,129 | A * | 5/2000 | Thomas et al. | 427/490 |
| 6,375,745 | B1 * | 4/2002 | Yira et al. | 118/716 |
| 6,596,342 | B2 * | 7/2003 | Batliner et al. | 427/242 |
| 2002/0081388 | A1 * | 6/2002 | Batliner et al. | 427/421 |
| 2002/0182338 | A1 * | 12/2002 | Stevens et al. | 427/457 |
| 2006/0193978 | A1 * | 8/2006 | Toth | 427/212 |
| 2007/0054126 | A1 * | 3/2007 | Yasui et al. | 428/411.1 |
| 2007/0187651 | A1 * | 8/2007 | Naruse et al. | 252/500 |
| 2009/0246366 | A1 * | 10/2009 | Sudo et al. | 427/212 |

* cited by examiner

COMPOSITE PARTICULATE PREPARING APPARATUS AND METHOD

BACKGROUND OF THE INVENTION

1. Field of the Invention

The present invention relates to a composite particulate preparing apparatus and method, by which an adhering material is made to adhere to particulates so as to form composite particulates.

2. Description of the Related Art

A physical vapor deposition method (PVD) or a chemical vapor deposition method (CVD) has heretofore been used as a method for causing an adhering material to adhere to an adhesion substance such as particulates. The CVD method is a method in which an adhering material is made to adhere to the adhesion substrate by a chemical reaction in vapor phase.

The PVD method is a method in which an adhering material is caused to adhere to the adhesion substance by thermal vapor deposition, sputtering, ion plating or the like.

Of the CVD method and the PVD method, an appropriate one is selected depending on a material constituting the adhesion substrate and an adhering material. If the adhesion substance is particulates, the PVD method having a comparatively wide range of selection of the adhering material is used. In particular, the sputtering method is frequently used.

The sputtering method is a method in which an anode and a cathode are arranged in a He or Ar gas atmosphere together with an adhesion substance and an adhering material (target) which are located between the anode and the cathode. In addition, voltage is impressed between both the electrodes, whereby the adhering material is sputtered from the target and made to adhere to the adhesion substance.

If the adhesion substance is particulates, various forms of sputtering apparatuses have been proposed in order to achieve uniform adhesion of the adhering material to the overall particulates. For example, a method is proposed in which composite particulates are prepared by pressing powder to the inner surface of a rotating stage by the centrifugal force caused by rotating the cylindrical stage. (See e.g. Japanese Patent Laid-Open No. 2008-45197.)

SUMMARY OF THE INVENTION

However, the adhesion of the adhering material by the sputtering method provides a low rate of forming films on the particulate surfaces; therefore, long time processing is needed. Further, the productivity cannot be improved depending on the applying range.

In contrast to this, the heating vapor deposition by the PVD method provides a high rate of forming an adhering film on an adhesion substance, thus, the superior productivity.

However, the heating vapor deposition cannot provide adhesion in the state where the adhering material is located above and the adhesion substance is located below the adhering material. Therefore, to adhere the adhering material to the adhesion substance by the heating vapor deposition, it is necessary to dispose the adhesion substance above the adhering material (the vapor deposition source) and heat the adhering material for evaporation.

In this case, to dispose the adhesion substance above the vapor deposition source, the adhesion substance needs to have a certain level of size. For example, if the adhesion substance is a substrate or the like, it is possible to fixedly suck the adhesion substance and allow it to face above the vapor deposition source. However, if the adhesion substance is particulates, it is difficult to dispose the adhesion substance above the vapor deposition source. Further, if a plurality of the particulates are disposed above the vapor deposition source, it is difficult to uniformly deposit the adhesion substance onto individual particulates.

As described above, if the particulates which are difficult to dispose above the vapor deposition source are the adhesion substance, the heating vapor deposition cannot allow the adhering material to adhere to the particulates.

In the above-mentioned method in which the cylindrical stage is rotated to press composite particulates against the inner surface of the rotating stage for sputtering, it is difficult to take out the resulting composite particulates from the cylindrical rotating stage. Therefore, the recovery rate will lower.

It is desired to provide a composite particulate preparing apparatus and method that can deposit an adhering material on particulates and increase a recovery rate.

According to an embodiment of the present invention, there is provided a composite particulate preparing apparatus including: a rotating body receiving particulates to which an adhering material is allowed to adhere and having a bottom surface, a side wall and a flange part; a centrifugal machine rotating the rotating machine to apply a centrifugal force to the particulates in the rotating body; an inclination varying device shifting the rotating body at an arbitrary inclination angle so that the bottom surface of the rotating body forms a vertical plane parallel to a gravitational direction from a horizontal plane perpendicular to the gravitational direction; and stirring means disposed closer to a horizontal line perpendicular to a vertical line drawn from a rotational center of the rotating body in a gravitational direction on a rotational side where the particulates drop from an uppermost point, than to the vertical line.

According to another embodiment of the present invention, there is a composite particulate preparing method including the steps of: putting particulates in a rotating body including a bottom surface formed like a disk, a side wall provided on the bottom surface and a flange part opposed to the bottom surface; rotating the rotating body to apply centrifugal force to the particulates; tilting the rotating body at an arbitrary angle so that the bottom surface of the rotating body is between a horizontal plane perpendicular to a gravitational direction and a vertical plane parallel to the gravitational direction; allowing an adhering material to adhere to the particulates in the rotating body; and stirring the particulates in the rotating body by means of stirring means disposed closer to a horizontal line perpendicular to a vertical line drawn from the rotational center of the rotating body in the gravitational direction on a rotation side where particulates drops from an uppermost point, than to the vertical line.

According to the composite particulate preparing apparatus and method of the embodiments of the present invention, the centrifugal force is applied to the particulates in the rotating body and the installation position of the stirring device is defined. Thus, the adhering material can be allowed to uniformly adhere to the front surfaces of the particulates with ease and the dropping off of the particulates from the rotating body can be suppressed to increase a recovery rate.

The present invention can provide the composite particulate preparing apparatus and method that can allow the adhering material to adhere to the particulates with ease and that are superior in recovery rate.

DETAILED DESCRIPTION OF THE PREFERRED EMBODIMENTS

Preferred embodiments of the present invention will hereinafter be described with reference to the drawings. However, the present invention is not limited to the embodiments described below.

The description is given in the following order.

1. Embodiment of composite particulate preparing apparatus
2. Composite particulate preparing method
3. Stirring devices 1. Embodiment of a Composite Particulate Preparing Apparatus A description is hereinafter given of a specific embodiment of the composite particulate preparing apparatus according to an embodiment of the present invention.

Figure 1:
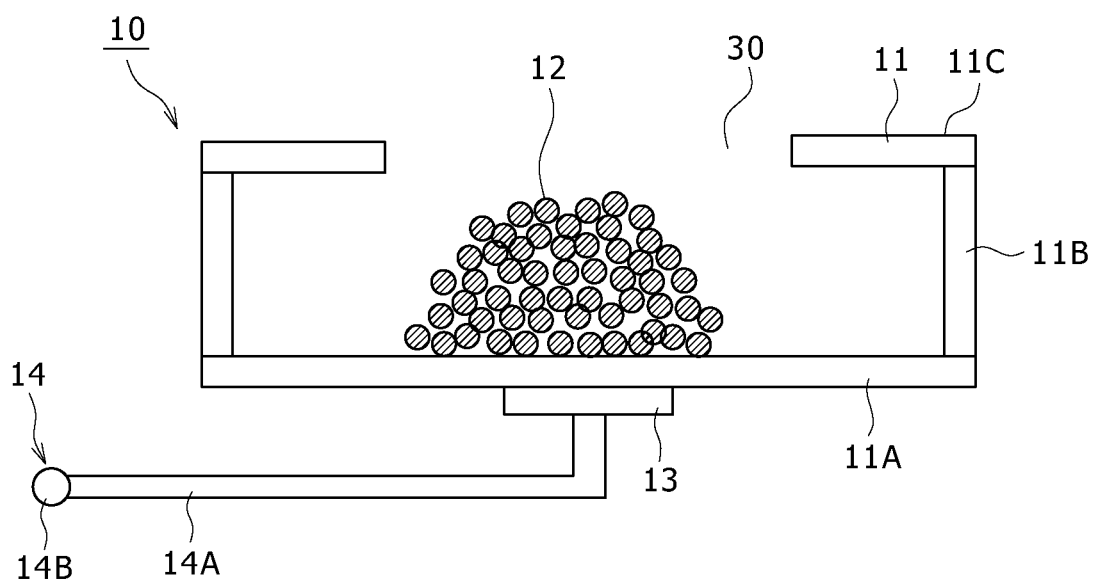
FIG. 1 illustrates a configuration of a composite particulate preparing apparatus according to an embodiment of the present invention.

FIG. 1 is a schematic configurational view of the composite particulate preparing apparatus according the embodiment.

Referring to FIG. 1, a composite particulate preparing apparatus 10 includes a rotating body 11 putting therein particulates 12 to which an adhering material is allowed to adhere; a centrifugal machine 13 rotating the rotating body 11; and an inclination varying device 14 which tilts and supports the rotating body 11 at an arbitrary angle.

In addition to the configuration as above, the apparatus 10 includes a stirring device not illustrated which is used to stir particulates 12, whose configuration is detailed in the below description of a composite particulate preparing method.

The rotating body 11 includes a bottom surface 11A, a side wall 11B, and a flange part 11C disposed at one end of the side wall 11B so as to face the bottom surface 11A.

The bottom surface 11A is formed like a disk, at whose central portion the centrifugal machine 13 is disposed.

The side wall 11B is disposed at a circumferential portion of the disk-like bottom surface 11A and formed to extend substantially perpendicularly to the bottom surface 11A. A central portion of the flange part 11C is provided with an opening portion 30 into which particulates 12 are thrown.

The inclination varying device 14 is composed of a turning support member 14A and an actuator 14B turning the turning support member 14A.

The actuator 14B is composed of a drive device such as a motor and turns the turning support member 14A at an arbitrary angle. The turning support member 14A is composed of a member that supports the rotating body 11 and the centrifugal machine 13 and tilts them at an arbitrary angle by driving the actuator 14B.

The centrifugal machine 13 is disposed between the bottom surface 11A of the rotating body 11 and the turning support member 14A of the inclination varying device 14. The rotating body 11 can be rotated with the turning support member 14A and the rotating body 11 tilted at an arbitrary angle by the inclination varying device 14.

The composite particulate preparing machine 10 is provided with a pressure reducing device not illustrated so that an adhering material can be allowed to adhere to the particulates 12 in the rotating body 11 in a pressure-reduced state. In addition, the composite particulate preparing apparatus 10 includes a vapor deposition device not illustrated which evaporates the adhering material in order to allow the adhering material to vapor-deposit onto the particulates 12.

2. Composite Particulate Preparing Method

A description is next given of a composite particulate preparing method using the preparing apparatus described above.

As illustrated in FIG. 1, before the start of the composite particulate preparing apparatus 10, the bottom surface 11A of the rotating body 11 rests on a horizontal plane perpendicular to the gravitational direction. The particulates 12 as an adhesion substance are thrown into the rotating body 11 from the opening portion 30.

During the throwing of the particulates 12, the bottom surface 11A of the rotating body 11 is made to form a horizontal plane perpendicular to the gravitational direction, which makes it easy to receive the particulates 12 therein.

The particulate 12 has a diameter of from several μm to several hundred μm and can use e.g. carbon, silicon, oxide, nitride and organic matter as well as metal and alloy. The particulate 12 can use substances without any specific restriction as long as they have a particulate form and can be subjected to vapor-deposition.

Figure 2:
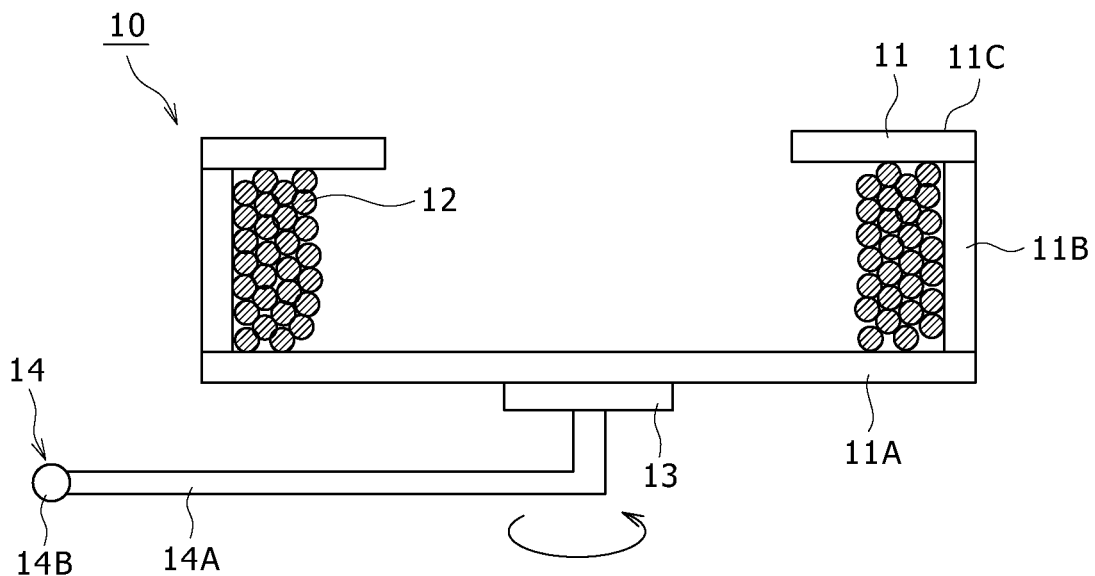
FIG. 2 illustrates an embodiment of a composite particulate preparation method according to an embodiment of the present invention.

As illustrated in FIG. 2, the rotating body 11 is next rotated by driving the centrifugal machine 13. The rotation of the rotating body 11 applies the centrifugal force to the particulates 12 received in the rotating body 11 to press them against the side wall 11B of the rotating body 11. In this way, the application of the centrifugal force to the particulates 12 can fix the particulates 12 on the side wall 11B of the rotating body 11.

Preferably, the rotation speed of the rotating body 11 is a speed at which a force of 2 G or more is applied to the side wall 11B so that the particulates 12 will not fall when the rotating body 11 is tilted by the inclination varying machine 14 until the bottom surface 11A of the rotating body 11 becomes parallel to the vertical direction.

Specifically, for example, the rotating body 11 includes the bottom surface 11A with a diameter of 40 cm, the side wall 11B with a height of 10 cm, and the flange part 11C with a width of 10 cm and is rotated at approximately 100 rpm.

The rotating body 11 is provided with the flange part 11C opposed to the bottom surface 11A. Even if the rotating body 11 is rotated, therefore, the particulates 12 to which the centrifugal force is applied can be fixed to the side force 11B without flying off from the inside of the rotating body 11.

Figure 3:
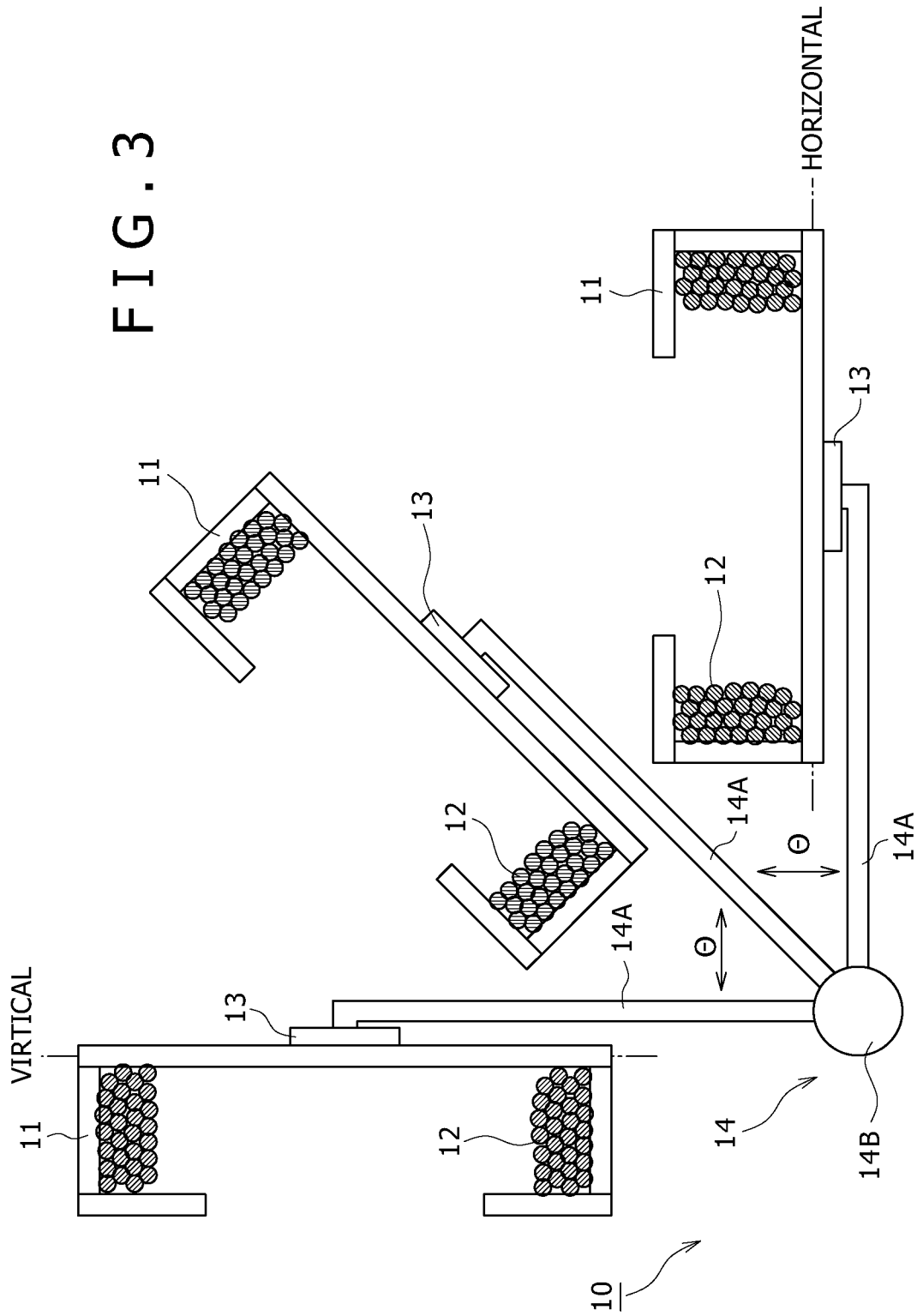
FIG. 3 illustrates the embodiment of the composite particulate preparation method according to an embodiment of the present invention.

Referring to FIG. 3, while the centrifugal machine 13 is next operated to apply the centrifugal force to the particulates 12 in the rotating body 11, the inclination varying device 14 turns the turning support member 14A. The turning support member 14A is turned to vary the rotating body 11 at an arbitrary angle θ so that the bottom surface 11A of the rotating body 11 varies from the horizontal plane perpendicular to the gravitational direction to the vertical plane parallel to the gravitational direction.

As described above, because of undergoing the sufficient centrifugal force, the particulates fixed to the side wall 11B by the centrifugal force will not fall but will stay on the side wall 11B of the rotating body 11 even if the rotational direction of the rotating body 11 is made vertical.

In order to make it easy for the adhering material to adhere to the particulates 12 pressed against the side wall 11B of the rotating body 11, the inclination angle (an angle of the turning support member 14A with respect to the horizontal plane) θ of the rotating body 11 is 45 to 135 degrees relative to the horizontal plane perpendicular to the gravitational direction. Further, the inclination angle θ is preferably 80 to 100 degrees, particularly preferably 90 degrees.

Figure 4:
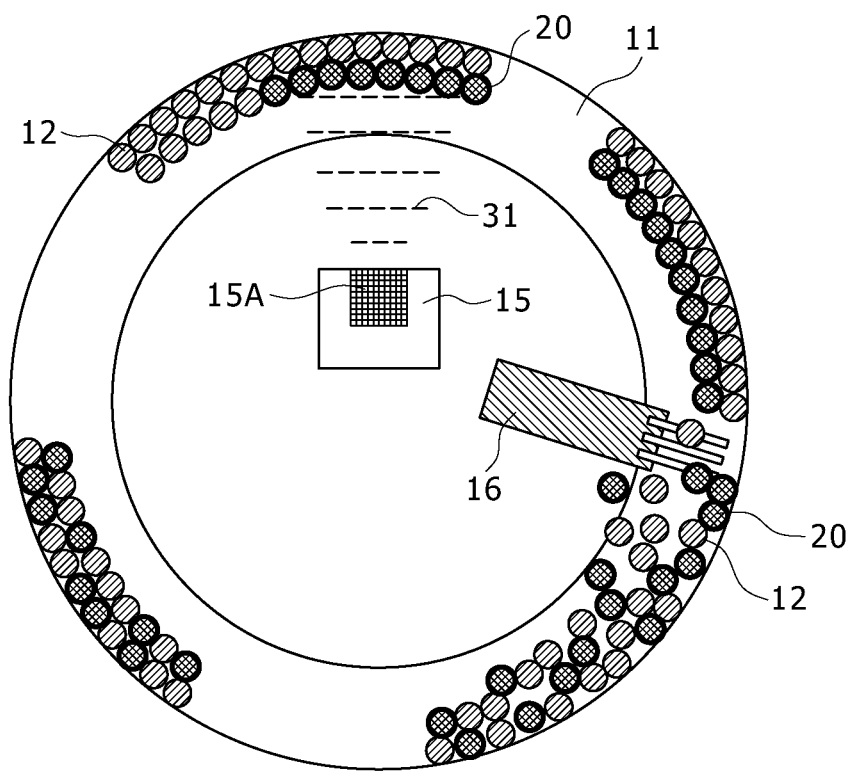
FIG. 4 illustrates the embodiment of the composite particulate preparation method according to an embodiment of the present invention.

As illustrated in FIG. 4, the vapor deposition device 15 is disposed in the composite particulate preparing apparatus 10 described above at a predetermined position. The vapor deposition device 15 receives an adhering material 15A, and heats and evaporates it to cause a release area 31 of the adhering material 15A. In this release area, the adhering material 15A can be vapor-deposited onto the particulates 12.

The adhering material 15A can use e.g. carbon, silicon, oxide, nitride and organic matter as well as metal and alloy. The adhering material 15A can use any material without particular restriction as long as it can be evaporated by the vapor deposition device and vapor-deposited onto the particulates 12.

Incidentally, FIG. 4 illustrates the rotating body 11 having the vertically tilted bottom surface 11A with the other configurations of the composite particulate preparing device 10 omitted for simplified explanation.

The composite particulate preparing apparatus of the present embodiment is provided with a stirring device 16. This stirring device 16 is used to stir in the rotating body 11 the particulates 12 pressed against the side wall 11B by the centrifugal force resulting from the rotation of the rotating body 11.

Referring to FIGS. 5A to 5D, while the rotating body 11 is being rotated, the vapor deposition device 15 heats and vapor-deposits the adhering material 15A, which adheres to the particulates 12.

In addition to the configuration illustrated in FIG. 4, the composite particular preparing apparatus 10 illustrated in FIGS. 5A to 5D is provided with a film-thickness monitor 17 for measuring the film thickness of the adhering material adhering to the particulate 12 at a position from which the particulates 12 in the rotating body 11 can be monitored.

In the composite particulate preparing apparatus 10 illustrated in FIGS. 5A to 5D, the stirring device 16 includes a support member 16A parallel to the side wall 11B of the rotating body 11 and a plurality of stick-like members 16B projecting like comb-teeth from the support member 16A in the same direction.

Figure 5:
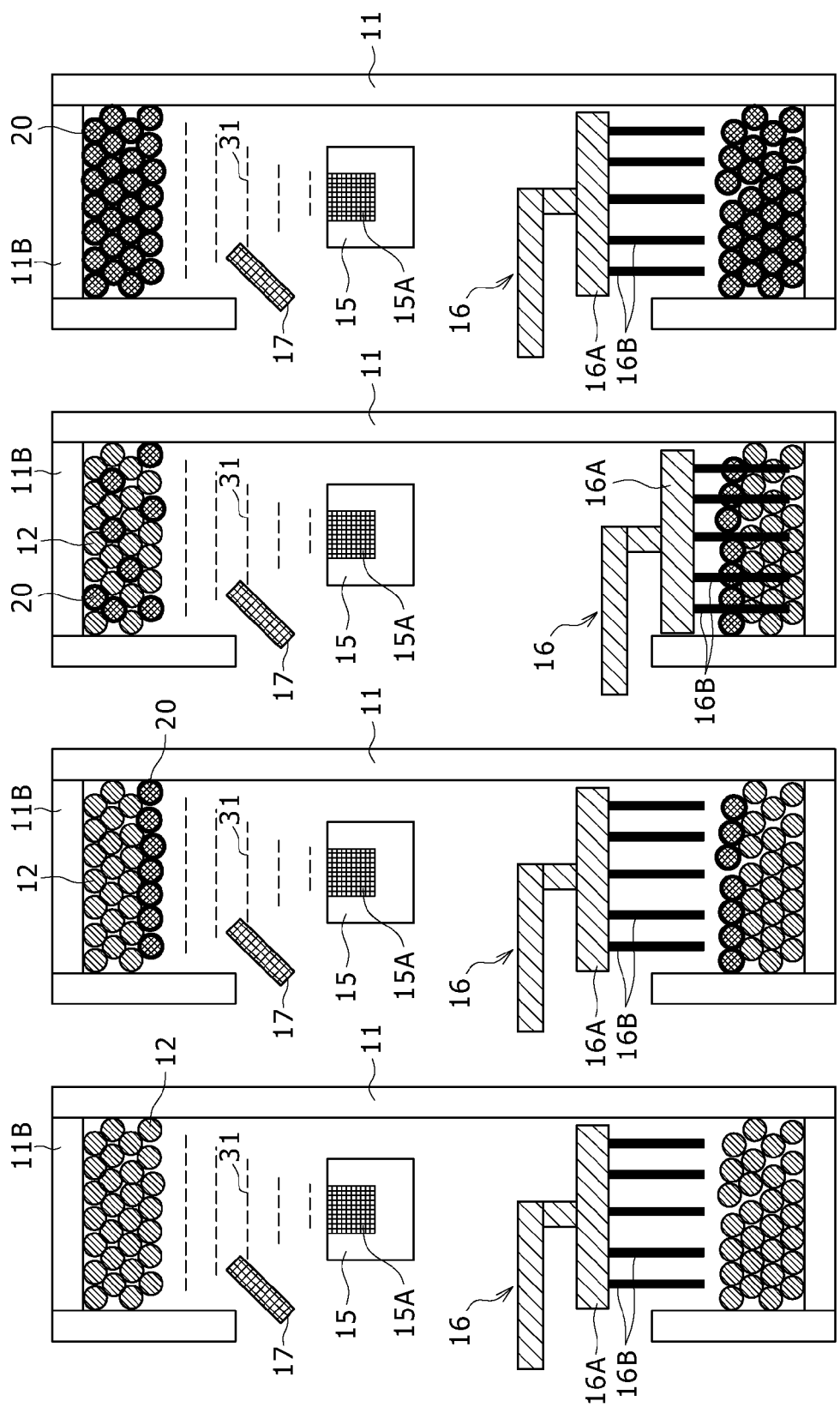
FIGS. 5A to 5D illustrate the embodiments of the composite particulate preparation method according to an embodiment of the present invention.

As illustrated in FIG. 5A, the rotating body 11 is first tilted by the inclination varying device 14 so that the bottom surface 11A is parallel to the vertical direction. The vapor deposition device 15 is disposed in the rotating body 11. The adhering material (the deposition source) 15A received in the vapor-deposition device 15 is heated for evaporation. The evaporation of the adhering material 15A starts the vapor deposition of the adhering material 15A onto the particulates 12.

As illustrated in FIG. 5B, the particulates 12 pressed by the centrifugal force against the side wall 11B in the rotating body 11 passes through the release area 31, i.e., passes in the direction where the heated adhering material 15A evaporates. Since the particulates 12 pass through the release area 31, the evaporated adhering material adheres to particulates 12 exposed to the central side front surface of the rotating body 11, of the plurality of particulates 12 pressed against the side wall 11B. The adhering material adheres to the particulates 12 to form composite particulates 20.

The particulates 12 are fixed to the side wall 11B by the centrifugal force resulting from the rotation of the rotating body 11 in preparing the composite particulates 20. The particulates 12 can stably be disposed at a position where the heated and evaporated adhering material is released, i.e., above the vapor deposition device 15. In this way, use of the heating vapor deposition allows the adhering material to adhere to the front surfaces of the particulates to prepare the composite particulates. Thus, the preparation efficiency of the composite particulates can be increased.

As illustrated in FIG. 5C, the particulates 12 in the rotating body 11 are next stirred using the stirring device 16. The stick-like members 16B of the stirring device 16 are inserted into the particulates 12 in the rotating body 11 to come into contact with the particulates 12. This contact replaces the front side composite particulates 20 deposited, with the particulates 12 not yet deposited in the rotating body 11.

As illustrated in FIG. 5D, while measuring the film thickness of the adhering material adhering to the particulates 12 by means of the film-thickness monitor 17, the composite particulates 20 are prepared in which the adhering material is allowed to adhere to the particulates 12 to a predetermined thickness.

Incidentally, the measured value of the film-thickness of the adhering material measured by the film-thickness monitor 17 may differ from the film thickness of the adhering material actually adhering to the particulate 12 depending on deposition conditions or the like in some cases. For this reason, a ratio of the value measured by the film-thickness monitor 17 to the measured value of the film-thickness of the adhering material actually adhering to the particulate is previously calculated. Based on this, the film thickness of the adhering material actually adhering to the particulate 12 can be calculated.

The stirring device 16 used comes into contact with particulates 12 and the composite particulates 20 in the rotating body 11 and stirs the particulates 12 pressed against and fixed to the side wall 11B. This replaces the particulates 12 in the center of the rotating body 11 with those close to the side wall 11B.

Where the adhering material is vapor-deposited by the vapor deposition device 15 is the front surfaces of the particulates 12 exposed to the central direction of the rotating body 11. Therefore, if the particulates are not stirred, only the front surfaces of the particulates 12 fixed to the side wall 11B are subjected to the vapor deposition as shown in FIG. 5B. Thus, entirely uniform composites cannot be obtained. The particulates 12 exposed to the central direction of the rotating body 11 are replaced with the other particulates 12 in the rotating body 11 by replacing the positions of the particulates 12 in the rotating body 11 through the stirring. The sufficient stirring of the particulates 12 can execute entirely uniform vapor deposition, thereby preparing the uniform composite particulates.

Figure 6:
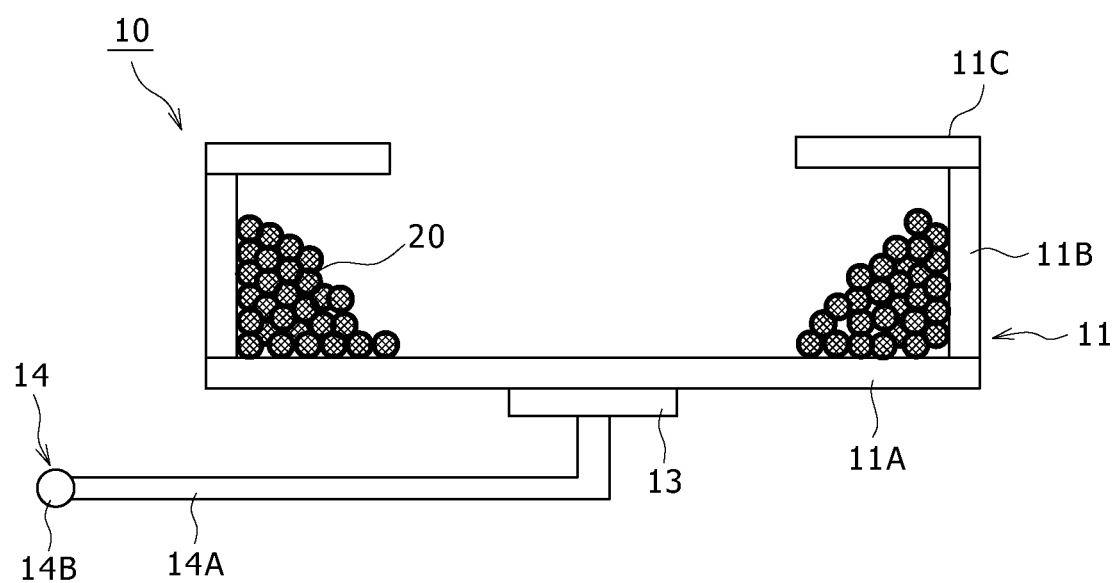
FIG. 6 illustrates the embodiment of the composite particulate preparation method according to an embodiment of the present invention.

Referring to FIG. 6, the turning support member 14A is next turned by the inclination varying machine 14 so that the bottom surface 11A of the rotating body 11 is shifted from the vertical plane parallel to the gravitational direction to the horizontal plane perpendicular to the gravitational direction, and the centrifugal machine 13 is stopped.

The centrifugal machine 13 is stopped to stop the rotation of the rotating machine 11, with the result that the composite particulates 20 pressed against the side wall 11B drop in the gravitational direction. The composite particulates 20 that have dropped are recovered.

The composite particulates can be prepared by the steps described above.

According to the composite particulate preparing method described above, when the composite particulates are recovered, the rotating body is turned so that the bottom surface is shifted to the horizontal plane perpendicular to the gravitational direction. Therefore, the composite particulates prepared by the above-mentioned method can be recovered efficiently.

Incidentally, in the composite particulate preparing apparatus described above, the stirring device 16 includes the support member 16A parallel to the side wall 11B of the rotating body 11 and the plurality of stick-like member 16B projecting like comb-teeth from the support member 16A in the same direction. However, the stirring device 16 can be made to have other configurations.

Figure 7:
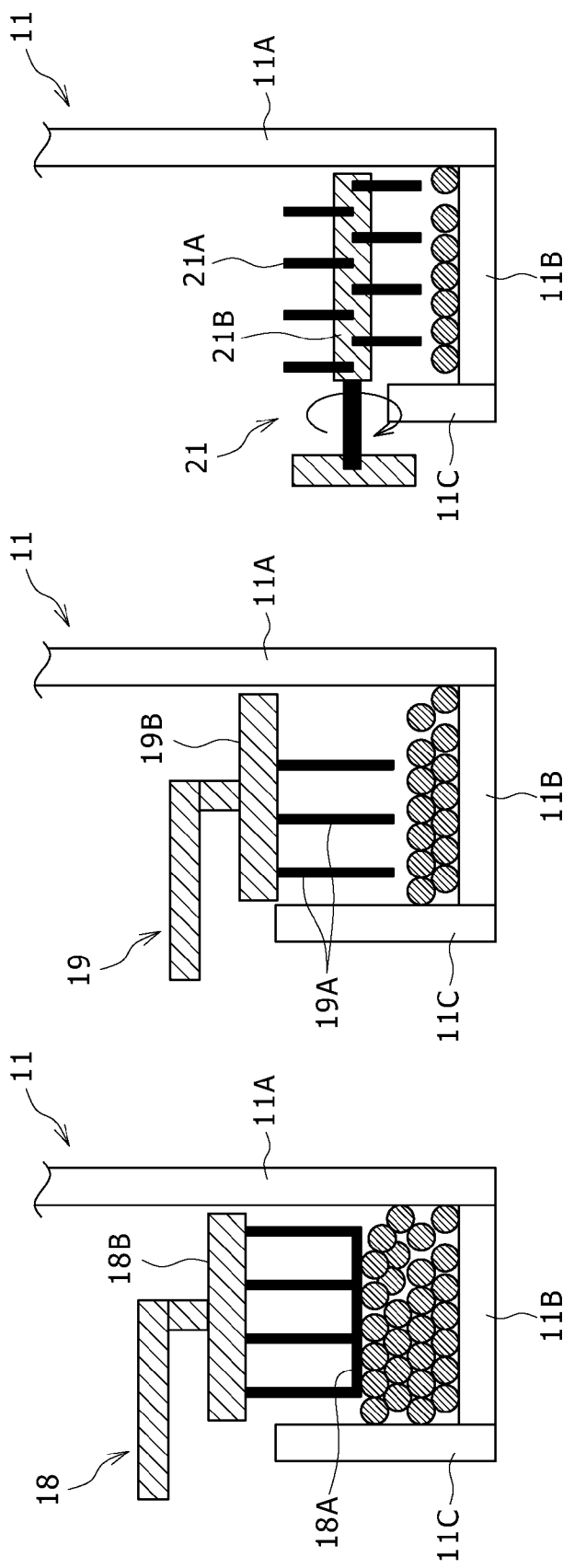
FIGS. 7A to 7C illustrate embodiments of a stirring device according to an embodiment of the present invention.

For example, as illustrated in FIG. 7A, if particulates 12 received in the rotating body 11 are in significant quantities, it is preferred to use a stirring device 18 that includes a support member 18B provided with a face member 18A coming into surface contact with a plurality of particulates 12. The rotating body 11 is rotated at a speed applying the centrifugal force to the particulates 12. Since the rotating particulates 12 and the face member 18A are in surface contact with each other, while the particulates 12 per se are rotating, the particulates 12 on the front surface side are replaced with the particulates 12 close to the side wall 11B.

As illustrated in FIG. 7B, if particulates received in the rotating body are in small quantities, it is preferred to use a stirring device 19 that includes a support member 19B provided with a plurality of stick-like members 19A coming into line contact with the plurality of particulates 12. The particulates 12 can be stirred uniformly by inserting the stick-like members 19A into the particulates 12 and reciprocating the support member 19B in a direction coaxial with the rotary axis of the rotating body 11.

As illustrated in FIG. 7C, if particulates 12 received in a rotating body 11 are in small quantities, it is preferred to use a stirring member 21 that includes a support member 21B and a plurality of stick-like members 21A projecting from the support member 21B to come into point contact with the plurality of particulates 12. The particulates 12 can be stirred uniformly by bring the distal ends of the stick-like members 21A into point contact with the particulates 12 with small inertia moment resulting from the rotation of the rotating body 11.

3. Stirring Devices

In the composite particulate preparing method described above, when the particulates are subjected to vapor-deposition in the rotating body, appropriate stirring may not be done. In such a case, it is difficult to allow the adhering material to adhere to the particulates at a uniform film-thickness.

If the strength of the stirring is high, the particulates pressed against the side wall of the rotating body are likely to drop off. On the other hand, if the strength of the stirring is low, the adhering material is vapor-deposited on only the particulates present on the front surface, of the plurality of particulates deposited at an arbitrary thickness from the side wall. Therefore, it is difficult to prepare uniform composite particulates.

The particulates in the rotating body reduce in speed in the rotating direction because of contact with the stirring device. In this case, if the particulates that have collided against the stirring device to lose the speed thereof in the rotating direction cannot recover the speed, the particulates cannot obtain sufficient centrifugal force so that they drop off from the rotating body during the rotation.

If the particulates drop off from the rotating body, a deposition amount estimated from charge becomes inaccurate, so that a recovery rate of composite particulates lowers. In the above-described composite particulate preparing method illustrated in FIGS. 5A to 5D, the vapor deposition is performed while checking the deposition amount by means of the film-thickness monitor. However, if the particulates drop off during the deposition, a sample input will vary so that an accurate deposition amount cannot be grasped. Further, if dropping into the deposition source, the particulates contaminate it.

It would appear that the speed reduction and drop of the particulates described above get involved with the contact position between the particulates and the stirring device in the rotating body. Even in the case where the contact with the stirring device reduces the speed of the particulates, if the rotation recovers the speed of the particulates, the sufficient centrifugal force is applied to the particulates, which are pressed in the side wall direction of the rotating body. Therefore, the dropping of the particulates is hard to occur. However, if the reduced speed resulting from the contact with the stirring device is not recovered, the sufficient centrifugal force cannot be obtained so that the particulates are likely to drop off.

The reason that the installation position of the stirring device has an influence on the speed of the particulates is considered as below.

The particulates coming into contact with the stirring device bounce in random directions.

The bouncing particulates are pulled by the gravity to drop in the rotating body. The dropping positions are different depending on the bouncing directions. If the dropping position of the particulates is a position where the speed in the rotating direction does not cancel the dropping speed, the centrifugal force of the particulates remains maintained.

The position where the speed in the rotating direction does not cancel the dropping speed is, e.g., between a vertical line drawn in the gravitational direction from the rotational center of the rotating body and a horizontal line perpendicular to the vertical line drawn in the gravitational direction from the rotational center of the rotating body, on the rotation side where the particulates drop from an uppermost point.

Figure 8:
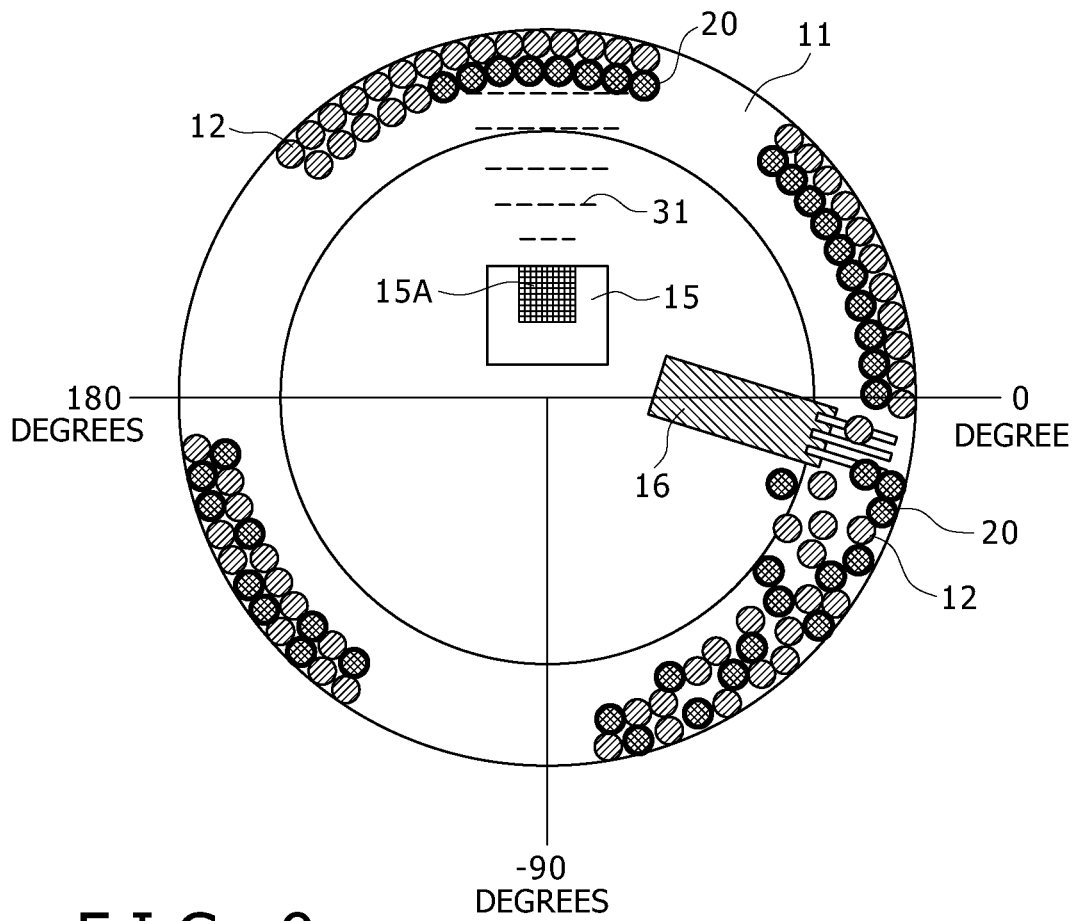
FIG. 8 illustrates a configuration of the embodiment of the composite particulate preparing apparatus according to an embodiment of the present invention.

This position is specifically denoted in the composite particulate preparing apparatus illustrated in FIG. 8. The horizontal line is defined as 0 degree, which is drawn from the rotation center of the rotating body 11 on the rotation side where the particulates 12 drop from the uppermost point. In addition, the vertical line is defined as −90 degrees, which is drawn from the rotation center of the rotating body. In this case, in FIG. 8, the position where the speed in the rotating direction does not cancel the dropping speed is between the vertical line (−90 degrees) in the gravitational direction of the rotating body and the horizontal line (0 degree) perpendicular to the vertical line in the gravitational direction.

As described above, at the position between the vertical line (−90 degrees) in the gravitational direction of the rotating body and the horizontal line (0 degree) perpendicular to the vertical line in the gravitational direction, vector in the rotation direction of the rotating body and vector in the gravitational direction have the same component. Therefore, such a position corresponds to the direction where the gravity by which the particulate drops and the rotational direction of the rotating body do not cancel each other. Thus, the particulates stay in the rotating body by being held by the centrifugal force.

However, if the dropping position of the particulates is a position to cancel the centrifugal force, e.g., is located in a direction where the particulates rise from the lowermost point, i.e., from the vertical line in the gravitational direction of the rotating body in FIG. 8. In this case, the vector in the rotating direction of the rotating body has vector reverse to the gravitational direction. Therefore, such a position corresponds to the direction where the gravity by which the particulate drops and the rotational direction of the rotating body cancel each other. Thus, the speed of the particulate is reduced so that the particulate is not held by the centrifugal force, which causes the dropping of the particulates.

Specifically, the dropping position of the particulates where the centrifugal force is canceled corresponds to the position from −90 degrees to 180 degrees in the composite particulate preparing apparatus illustrated in FIG. 8.

As described above, if the dropping position of the particulates is on the rotational direction side from the vertical line (−90 degrees) in the gravitational direction of the rotating body, the dropping speed of the particulates cancels the rotational direction of the rotating body. The particulates are not held by the centrifugal force so as to be likely to drop off.

The behavior of the particulate at the position where the stirring device is installed is described above. Actually, a plurality of factors are added such as contact of particulates in the rotating body, the physicality of the particulate and the like. However it is considered that the behavior of the particulates at the position where the stirring device is installed is a key factor of the dropping of the particulates.

As described above, the stirring device is installed closer to the horizontal line (0 degree) perpendicular to the vertical line in the gravitational direction of the rotating body than to the vertical line (−90 degrees) in the gravitational direction. Although the particulates collide with the stirring device to lose the speed in the rotational direction, they undergo the sufficient centrifugal force applied in the rotating direction by the rotating body in the dropping process. Thus, it is possible to prevent the dropping of the particulates.

Accordingly, the composite particulate preparing apparatus, the rotation number and the position of the stirring device are optimized depending on the physicality of the particulate. This can prevent a reduction in the recovery rate resulting from the dropping of the particulates to provide a maximum value of the recovery rate and to prevent contamination of the deposition source.

EXAMPLE

The present invention is specifically described based on the following example.

A recovery rate of particulates was confirmed using the actual composite particulate preparing apparatus.

The composite particulate preparing apparatus was configured to include a rotating body composed of a bottom surface with a diameter of 40 cm, a side wall with a height of 10 cm and a flange part with a width of 10 cm.

Particulates each containing iron as a major ingredient and having an average diameter of approximate 20 μm were thrown into the rotating body. The charge of the particulates was in such a quantity that the particulates pressed against the side wall by the centrifugal force have a height of 3 to 4 cm.

In the present example, in the state where the rotating body was tilted by the inclination varying device so that the bottom surface of the rotating body formed a vertical plane parallel to the gravitational direction, the installation angle of the stirring device was varied and only the stirring processing was performed for two hours without deposition processing while applying sufficient centrifugal force to the particulates. Then, a recovery rate of particulates staying in the rotating body after the stirring processing was checked.

The recovery rate was checked for comparison by changing the installation angle of the stirring device for each 15 degrees from 15 to −90 degrees with the horizontal direction from the rotating axis defined as 0 degree and the vertical position of the gravitational direction defined as −90 degrees.

Figure 9:
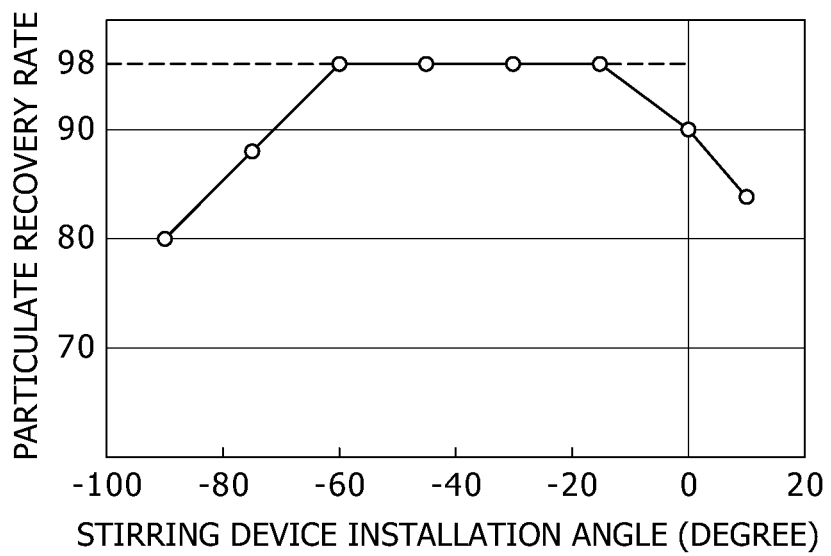
FIG. 9 is a graph illustrates the relationship between an installation angle of the stirring device of the embodiment and a particulate recovery rate.

FIG. 9 illustrates the relationship between the installation angle of the stirring device and the recovery rate of the particulates.

If the stirring device is installed at a position corresponding to −90 degrees, the recovery rate is about 90%. In other words, about 10% of the particulates could not be recovered because of dropping and the like. However, if the stirring device is installed at a position corresponding to −75 degrees, the recovery rate is improved compared with the case where the stirring device is installed at a position corresponding to −90 degrees. This result shows that the dropping of the particulates can be reduced to improve the recovery rate by the following. That is to say, the stirring device is installed closer to the position corresponding 0 degree than to the position closer to −90 degrees, i.e., closer to the horizontal line perpendicular to the vertical line drawn from the rotational axis of the rotating body in the gravitational direction than to the vertical direction.

If the stirring device is installed at a position corresponding to between −15 and −60 degrees, the recovery rate is approximately 98%, i.e., is significantly improved. In order to prevent dropping of the particulates resulting from the stirring, the stirring device is installed between −15 degrees from the horizontal line drawn from the rotational center of the rotating body and −60 degrees from the vertical line drawn from the rotational center of the rotating body, on the rotational direction side where the particulates are processed from the uppermost point.

By setting the stirring device at a position corresponding to −60 degrees or lower, it is ensured that the dropping position of the particulates coming into contact with and bouncing off the stirring device is at −90 degrees or lower. This improves the recovery rate.

Incidentally, if the stirring device is installed closer to the uppermost point (90 degrees) side than to 0 degree, the particulates coming into contact with and bouncing off the stirring device drop closer to 0 degree than to −90 degrees. Therefore, while the recovery rate is satisfactory due to the small lowering of the centrifugal force, such an installation is not preferably in view of the apparatus.

For this reason, in the experimental conditions the stirring device is installed in a range from −15 to −60 degrees. Therefore, even if the particulates collide with the stirring device to lose speed in the rotational direction, they are subjected to the sufficient centrifugal force by the rotating body in the process of dropping in the rotational direction. Thus, it is possible to prevent the reduction in the recovery rate resulting from the dropping of the particulates from the container and to suppress the contamination of the deposition source resulting from the dropping of the particulates into the deposition source.

The present invention is not limited to the embodiments described above. It should be understood by those skilled in the art that various modifications, combinations, sub-combinations and alternations may occur depending on design requirements and other factors insofar as they are within the scope of the appended claims or the equivalents thereof.

The present application contains subject matter related to that disclosed in Japanese Priority Patent Application JP 2009-210869 filed in the Japan Patent Office on Sep. 11, 2009, the entire content of which is hereby incorporated by reference.

What is claimed is:

1. A composite particulate preparing apparatus, comprising:
   a rotating body configured to receive particulates to which an adhering material is allowed to adhere, the rotating body having a bottom surface, parallel side wails, and a flange part;
   a centrifugal machine configured to rotate the rotating body and apply a centrifugal force to the particulates in the rotating body;
   inclination varying means configured to shift the rotating body to an inclination angle so that (i) the bottom surface of the rotating body forms a vertical plane parallel to a gravitational direction from a horizontal plane perpendicular to the gravitational direction, and (ii) the side walls of the rotating body are parallel to the horizontal plane;
   stirring means disposed closer to a horizontal line perpendicular to a vertical line drawn (i) from a rotational center of the rotating body, (ii) in a gravitational direction, and (iii) on a rotational side where the particulates drop from an uppermost point of the rotating body, than to the vertical line; and
   a deposition device (i) disposed within the rotating body, and (ii) configured to cause the adhering materiel to be deposited onto the particulates.

2. The composite particular preparing apparatus according to claim 1, wherein in the rotating body the horizontal line is defined as 0 degree and the vertical line as −90 degrees, the stirring means is disposed between −15 degrees and −60 degrees.

3. The composite particulate preparing apparatus according to claim 1, wherein the stirring means has a shape in surface contact, line contact, or point contact with a plurality of the particulates in the rotating body.

4. The composite particular preparing apparatus according to claim 1, wherein the horizontal line is aligned with a rotational axis of the rotating body.

5. The composite particular preparing apparatus according to claim 1, wherein the stirring means includes a support member extending (i) parallel to the parallel side walls of the rotating body, and (ii) out of the rotating body.

6. The composite particular preparing apparatus according to claim 1, wherein the deposition device is configured to cause the adhering material to be deposited onto the particulates by heating the adhering material.

7. The composite particular preparing apparatus according to claim 1, wherein the deposition device is configured to cause the adhering material to be deposited onto the particulates by causing the adhering material to evaporate.

8. The composite particular preparing apparatus according to claim 1, wherein the deposition device is configured to cause the adhering material to be vapor deposited onto the particulates.

9. The composite particular preparing apparatus according to claim 1, wherein the stirring means is disposed closer to the vertical line drawn from the rotational center of the rotating body in the gravitational direction than to another vertical line extending (i) from the vertical line from the rotational center of the rotating body, (ii) in a direction opposite to the gravitational direction on a side opposite to the rotational side where the particulates drop from the uppermost point of the rotating body, and (iii) perpendicular to the horizontal line.

10. The composite particular preparing apparatus according to claim 8, wherein the deposition device is configured to cause the adhering material to be deposited onto the particulates within a release area disposed along the another vertical line.

11. The composite particular preparing apparatus according to claim 1, wherein the deposition device is configured to cause the adhering material to be deposited onto the particulates within a release area disposed above the deposition device.

12. The composite particular preparing apparatus according to claim 1, wherein the deposition device is configured to cause the adhering material to be deposited onto a surface of the particulates facing a rotational center of the rotating body.

13. The composite particular preparing apparatus according to claim 1, wherein the centrifugal machine is configured to cause the particulates to be pressed against the side walls of the rotating body while the rotating body transports the particulates through an area containing the adhering material.

* * * * *